United States Patent [19]
Kienzle et al.

[11] Patent Number: 5,297,054
[45] Date of Patent: Mar. 22, 1994

[54] EXPERT SYSTEM FOR AUTOMICALLY GENERATING GEAR DESIGNS

[75] Inventors: Kent H. Kienzle, Ypsilanti, Mich.; Mark J. Jeffery, Sunnyvale, Calif.; Trent R. Jaeger, Troy; Karon A. Barber, Bloomfield Hills, both of Mich.

[73] Assignee: General Motors Corporation, Detroit, Mich.

[21] Appl. No.: 864,880

[22] Filed: Apr. 3, 1992

[51] Int. Cl.$^5$ .............................................. G06F 15/46
[52] U.S. Cl. ................................ 364/474.24; 364/401; 364/512; 395/919
[58] Field of Search ................. 364/468, 478, 401–403, 364/474.24, 191–193, 512; 395/904, 919–923, 50

[56] References Cited
U.S. PATENT DOCUMENTS

| | | | |
|---|---|---|---|
| 4,998,206 | 3/1991 | Jones et al. | 364/132 X |
| 5,016,204 | 5/1991 | Simoudis et al. | 395/919 X |
| 5,089,970 | 2/1992 | Lee et al. | 364/131 X |
| 5,208,768 | 5/1993 | Simoudis | 395/919 X |

Primary Examiner—Joseph Ruggiero
Attorney, Agent, or Firm—Howard N. Conkey

[57] ABSTRACT

An automated generative gear design process, which designs parallel axis gearsets to meet constraints and performance goals. The process uses state space searches, generate and test, and other knowledge based techniques to automatically generate gearset designs and recommend cutting and inspection tools. Specific knowledge applied includes standard gear and gearset equations and conditions for use, standard and specially developed gearset design methodologies, models of generic gears and gearsets, the specific limitations of geometry of various gears and gearsets, the ability to evaluate designs based on performance relative to goals, characteristics of available cutting and inspection tools, lubricants, and materials.

1 Claim, 12 Drawing Sheets

INPUT SIMPLE-PLANETARY NEW-GEAR-TRAIN MIN-INPUT-DESIGN

NEW-GEAR TRAIN

| | |
|---|---|
| Gear Set: | INPUT |
| Arrangement: | SIMPLE-PLANETARY |
| Design Option: | MIN-INPUT-DESIGN |
| Gear Type: | HELICAL |
| Planet Spacing: | EQUAL |
| Phasing: | COUNTER-PHASE |
| Gear Box Axial: | ? |
| Gear Box Radial: | ? |
| Mode: | SECOND-GEAR |
| Gear Ratio: | ? |
| Input Torque: | 325 |
| Input Speed: | 100 |
| Cutters: | ? |
| Materials: | (INPUT-SUN 8620-STEEL-CARBURIZED-AND-SHOT-PEENED) |
| | (INPUT-PINION 8620-STEEL-CARBURIZED-AND-SHOT-PEENED) |
| | (INPUT-INTERNAL 8620-STEEL-CARBURIZED-AND-SHOT-PEENED) |
| Existing Gears: | ? |

Design Goals

Relative Weights of Goals

Left: 10X Center: 1X Right: 0.1X

Life: Longer — Shorter
Size: Smaller — Larger
Weight: Lighter — Heavier
Noise: Softer — Louder
Cost: Lower — Higher
Search: More — Less

*Fig. 9*

NEW-GEAR-TRAIN MIN-INPUT-DESIGN

*BENDING-STRESS-FOCUSED*

1. ☐ Teeth Limits
   Estimate the ranges for the number of teeth of the sun and internal based on the gear ratio and number of teeth of the pinion.

2. ☐ Finest Teeth
   Compute the actual gear ratio and numbers of teeth. Estimate the $P_s$ based on the helix angle range. Select the finest pitch gears first.

3. ☐ Estimate Size
   Determine the gear set size and weight based on which design best meets the design goals.

4. ☐ Estimate $\phi_n$ and $\psi$
   Estimate good generating criteria for gear set based on $\phi_n$ and $\psi$. The selected design has the best rating based on design goals.

5. ☐ Fine Tune; Balance Stresses
   The operating conditions, $C'$ and $t_p$ are varied to determine the design with the most balanced bending stress.

Initial Parameter Values

| | Limits | Values | Units |
|---|---|---|---|
| $T_i$ | (0 50,000) | 325 | ft-lbs |
| $n_s$ | (1 40,000) | 100 | RPM |
| $l_g$ | (0.3 0.6) | | in |
| $l_t$ | (1.5 28) | | in |
| $\psi$ | (15 30) | | degrees |
| $\phi_n$ | (15 25) | | degrees |
| $N_p$ | (14 35) | | teeth |
| $M_G$ | (2.91 3.01) | | |
| N-of-pinion | (1 10) | 4 | |
| $s_b$ | (0 160,000) | | PSI |
| $m_p$ | (0.8 2.5) | | |
| $m_F$ | (0.5 4) | | |
| $s_{b,min}$ | (0 100,000) | 80,000 | PSI |
| $s_{c,max}$ | (0 400,000) | 250,000 | PSI |

*Fig. 11*

EXPERT SYSTEM FOR AUTOMICALLY GENERATING GEAR DESIGNS

FIELD OF THE INVENTION

This invention relates to designing gears and more particularly to an expert system for automated generative gear design which utilizes a process which designs parallel axis gearsets to meet constraints and performance goals. The process uses state space searches, generate and test, and other knowledge based techniques to automatically generate gearset designs and recommend cutting and inspection tools.

BACKGROUND OF THE INVENTION

The traditional gear design process, used in the gear industry generally, requires heavy human involvement, can be time consuming, and is dependent on the expertise of the individual gear designers. Different designers use different approaches, resulting in a lack of standardization. Because of the user intensiveness of the current process and the breadth and depth of knowledge required, the resultant design is most often only acceptable rather than near-optimum. The current process is shown in FIG. 1.

SUMMARY OF THE INVENTION

This invention solves the shortcomings of the current process and provides other advantages. The process can be used in the conceptual stage of gear design, before geometry or details of specific performance requirements are established. This process generates multiple designs by choosing a Design Approach based on performance goals, and using the approach to determine which standard gear and gearset design equations to apply to generic gear and gearset models. The process then chooses the "best" design to meet performance criteria and design constraints.

The gear designer supplies design goals and constraints. Constraints can range from the size envelope to the use of an existing gear or gears in the gearset to be designed. The option is available to set specific evaluation equations and establish allowable ranges for parameters. Based on the gear designer's choice of input and the Design Approach, which can be selected automatically by the process or chosen by the user, an equation sequencer applies standard gear design equations to generic gearset models by combining hundreds of equations to calculate gear parameters. The equations are applied by both standard and innovative Design Approaches to produce several thousand potential designs. The goals, constraints, Design Approach, and sequenced equations are distilled into an automatically generated program used to generate, sort and evaluate designs. Thousands of equations are evaluated half a million times in just a few minutes. The gear design expert can control the generation, evaluation, and sorting of designs with a high-level language developed specifically for the purpose, or the process can automatically make these decisions. Designers have direct access to the equations and Design Approaches used in the process. All design process operations are open to monitoring and exploration by the gear designer. For example, the complete derivation sequence, including intermediate values, for any parameter can be displayed for any of the potential designs. This permits inspection, verification and continued refinement of the process.

Up to approximately 250 of the best designs are available to the user for examination. Tools are provided to automatically evaluate gear designs relative to specified design goals. Hundreds of designs can be sorted and compared, both graphically and numerically.

From a broader perspective, by accepting standard equations and approaches from knowledge bases as input, this process encourages the accumulation of corporate expertise in long-term knowledge bases whose value will outlive the process. The knowledge can be retained and refined. This knowledge is external to the process and can be changed by domain experts. This permits continued evolution of the state of the art without modification to the process itself, making the process a testbed for experimentation and development.

Traditional analysis processes for gear design are "black boxes" that provide the designer with results, but not with explanations and the reasoning used; are not easily modified or inspected; do not suggest alternative designs; or recommend modifications to improve existing designs.

The process of the present invention is usable by both expert and novice gear designer. Experienced designers can interact heavily with the system, by specifying ranges for parameters, providing detailed inputs, and exploring the resultant design space. An expert can direct the design process, examine the set of designs being considered, and override system choices. New approaches to gear design can be tried out, new approximations added, and results directly compared. Hundreds of designs can be compared on the basis of any common parameter. Novices can learn about the underlying domain knowledge by viewing parameter definitions, equations, value derivations, and design strategies. Tools are in place to lead the beginning gear designer to an understanding of the approaches and calculations used to design gearsets. For example, the entire derivation sequence of any parameter is available in standard American Gear Manufacturers' Association format.

BRIEF DESCRIPTION OF THE DRAWINGS

The above and other advantages of the present invention will become more apparent from the following description taken in conjunction with the accompanying drawings wherein like references refer to like parts and wherein:

FIG. 9 shows the design goals and high-level constraints as changed by the gear designer.

FIG. 11 shows the default parameter values recommended for the selected combination of goals, high-level constraints, and Design Approach.

DETAILED DESCRIPTION

Figure 1:
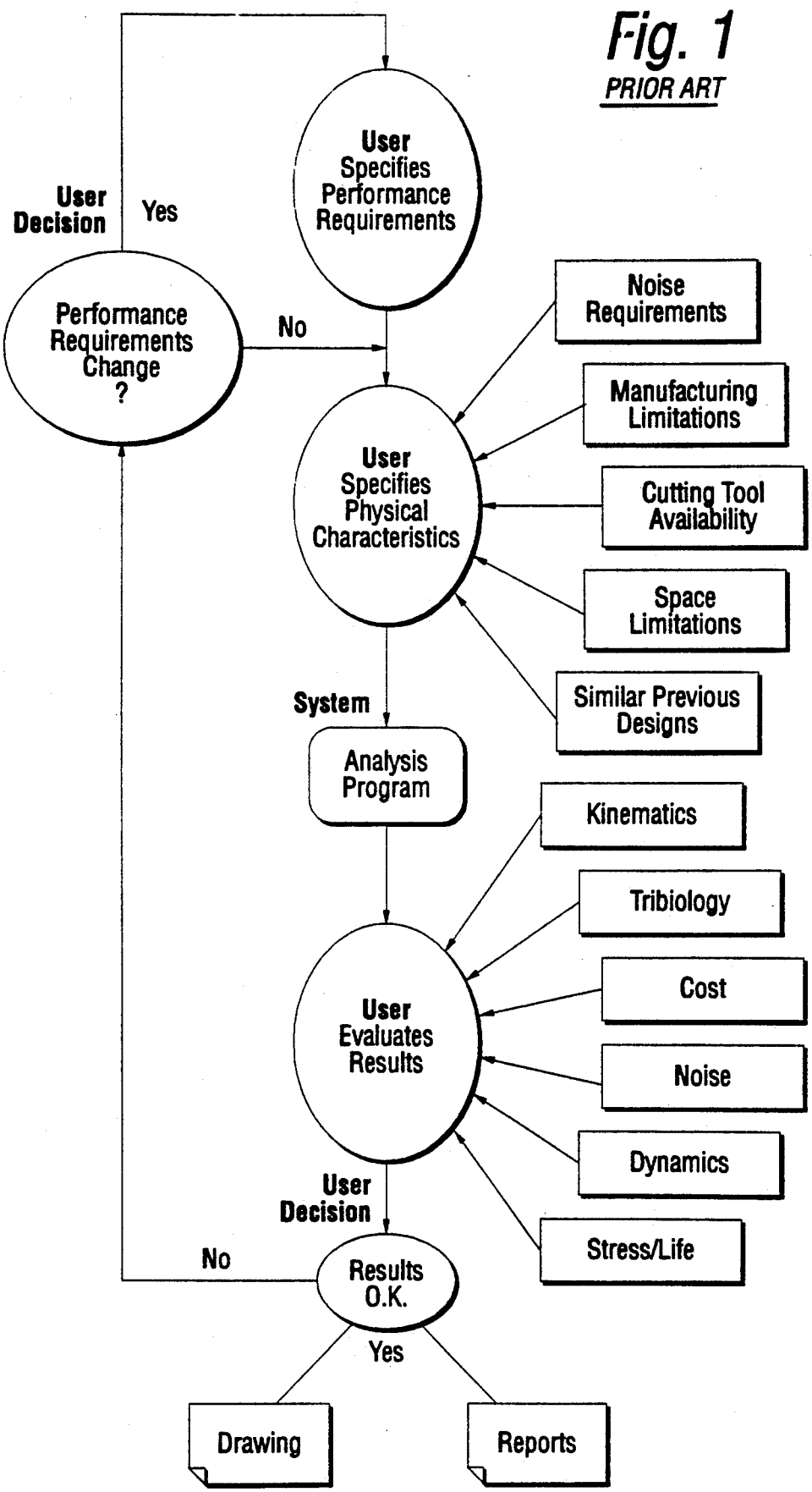
FIG. 1 shows the traditional gear design process.

Referring now to the drawing and initially to FIG. 1: The traditional gear design process, in use by the gear industry generally, requires heavy human involvement, can be time consuming, and is dependent on the expertise of the individual gear designers. Different designers use different approaches, resulting in a lack of standardization. Because of the user intensiveness of the current process and the breadth and depth of knowledge required, the resultant design is most often only acceptable rather than near-optimum. The traditional approach requires a great deal of expertise by the gear designer during the conceptual design stage.

Figure 2:
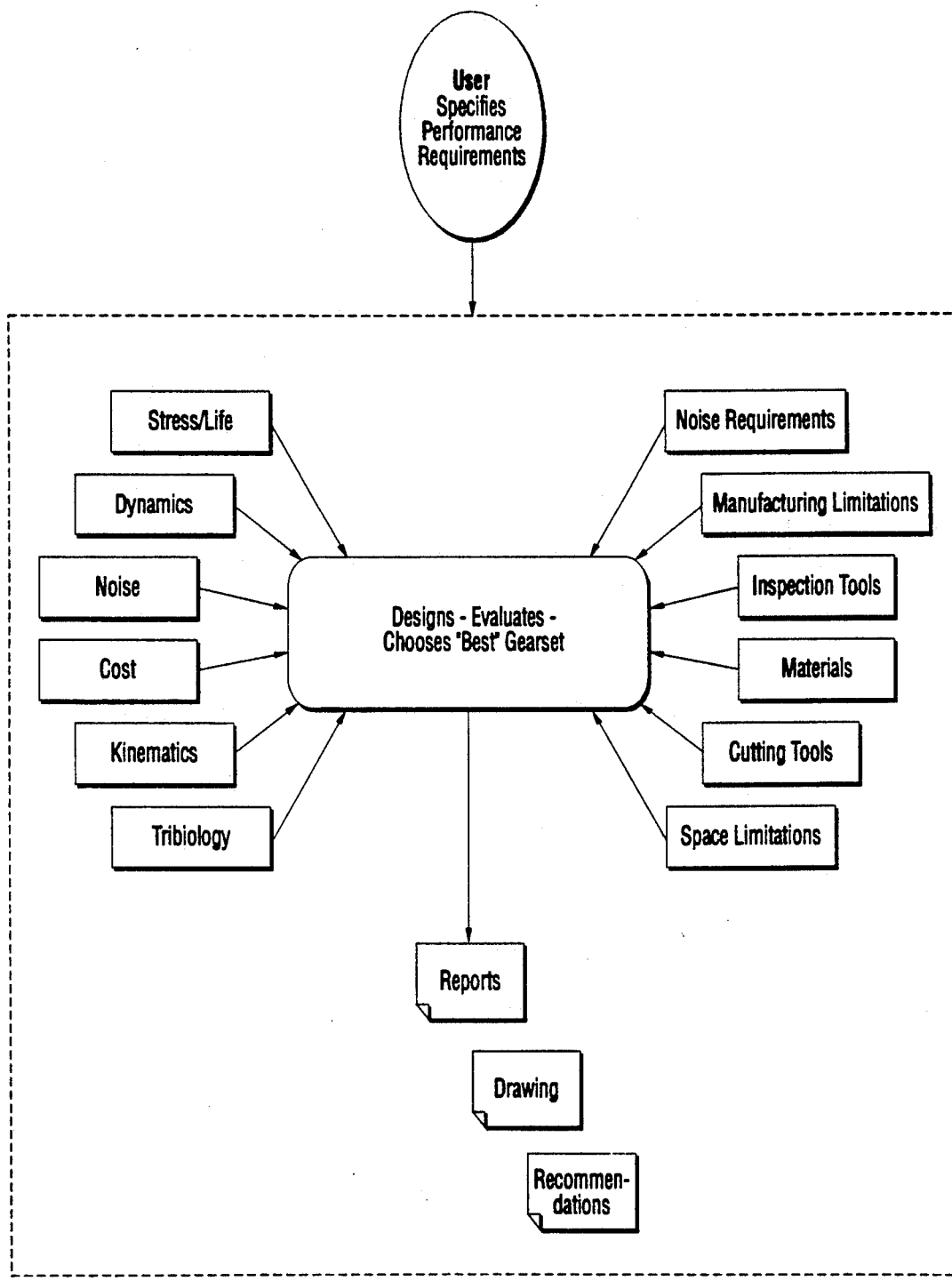
FIG. 2 shows information flow directly into the automated generative gear design process rather than through the gear designer as in the traditional process.

FIG. 2 is one embodiment of the present invention. The knowledge required of a human gear designer is shown captured in knowledge bases, available for automatic use in designing gearsets.

Figure 3:
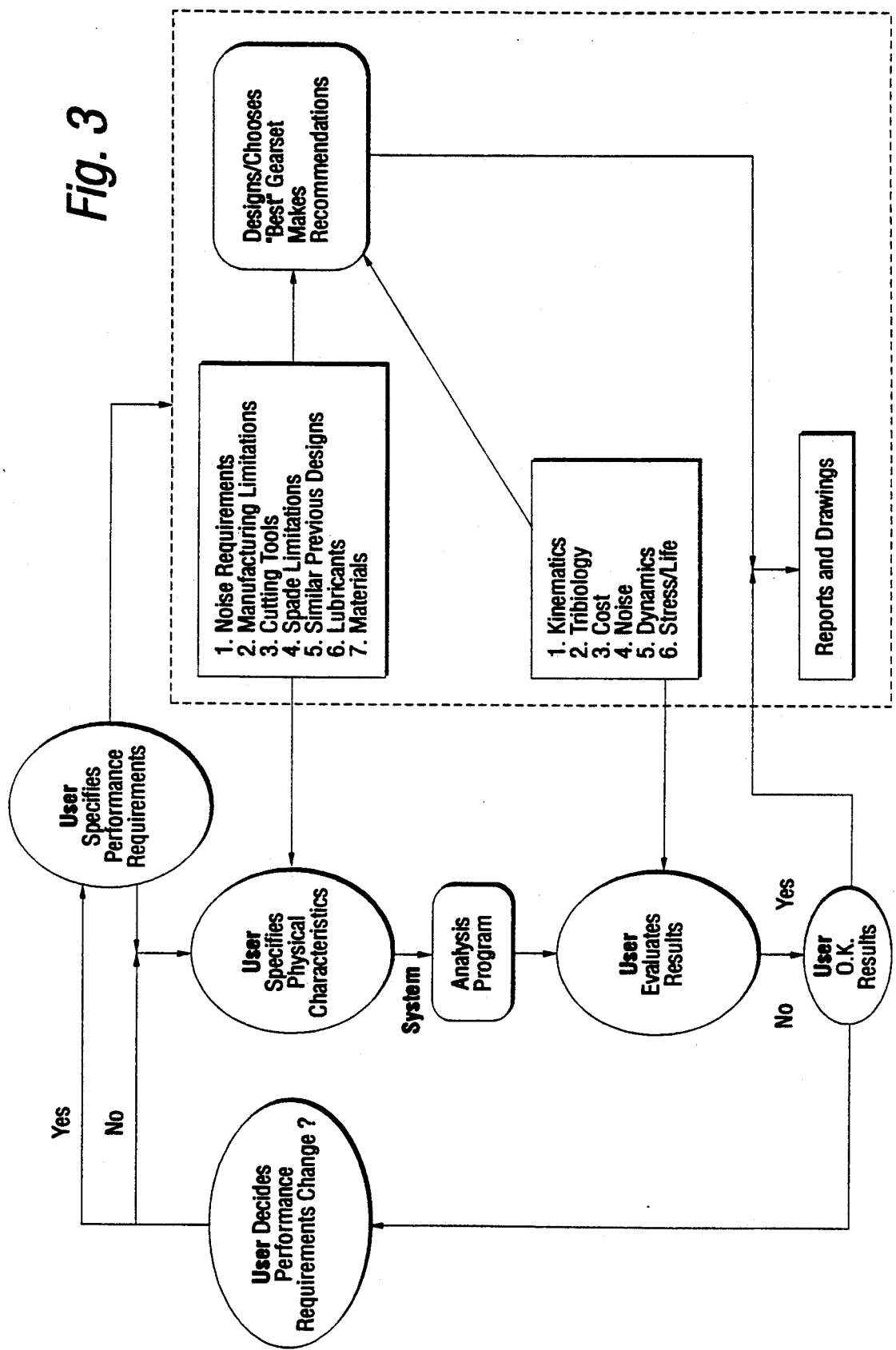
FIG. 3 compares the traditional and automated generative gear design process of handling information. In the traditional process the gear designer brings the knowledge to the process. In the automated generative process, the system contains and uses this knowledge as needed.

FIG. 3 is included to more clearly compare the traditional method to our invention.

Figure 4:
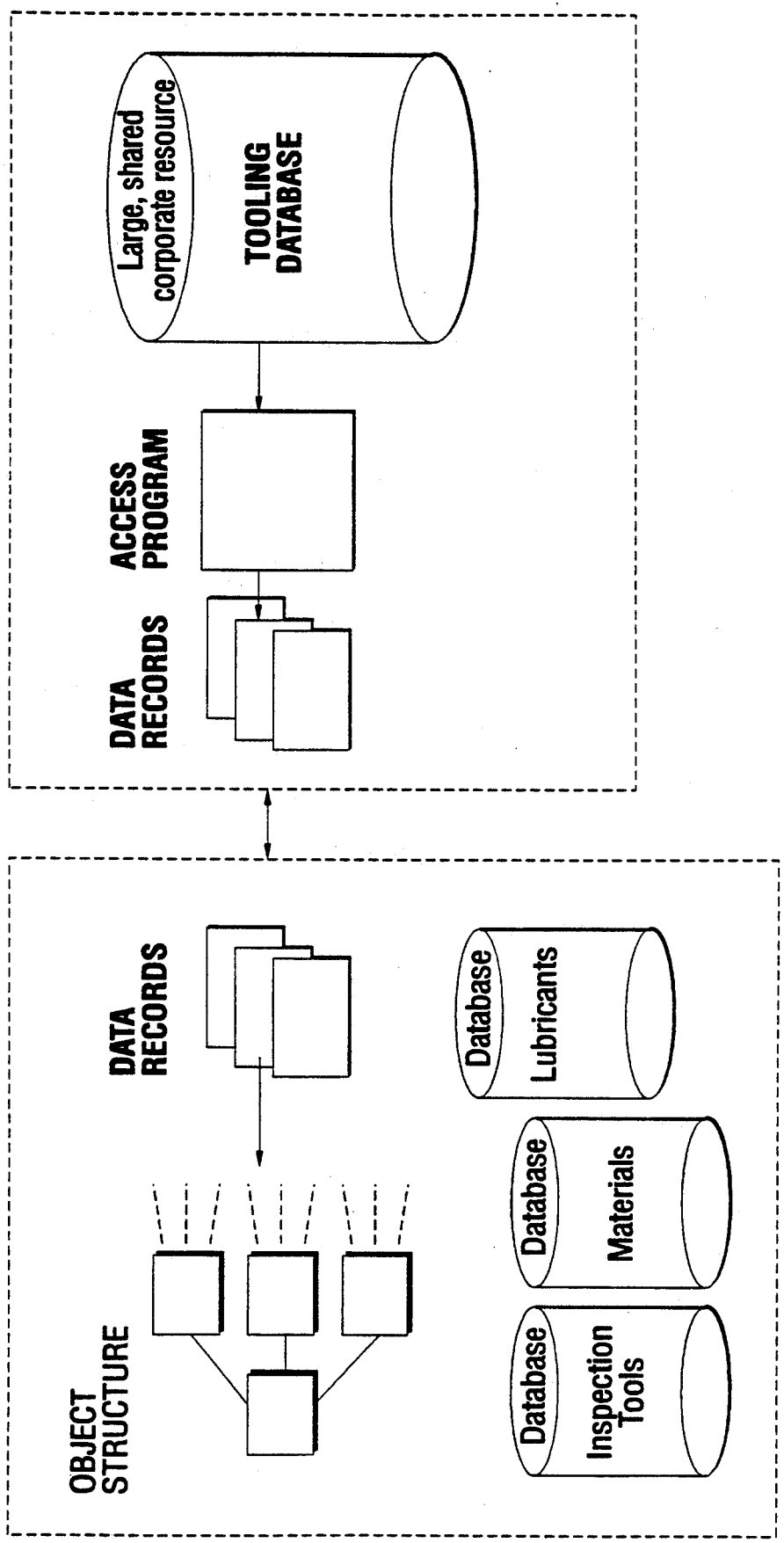
FIGS. 4 and 5 show the architecture for the automated generative gear design process.

FIG. 4 shows a high level architectural diagram of the present invention. The process runs in a commercially available expert system building tool, from IntelliCorp. Databases for inspection tools, materials, and lubricants are emulated within the process. An external database, a large shared corporate resource, is accessed for availability and attribute information on cutting tools.

Figure 5:
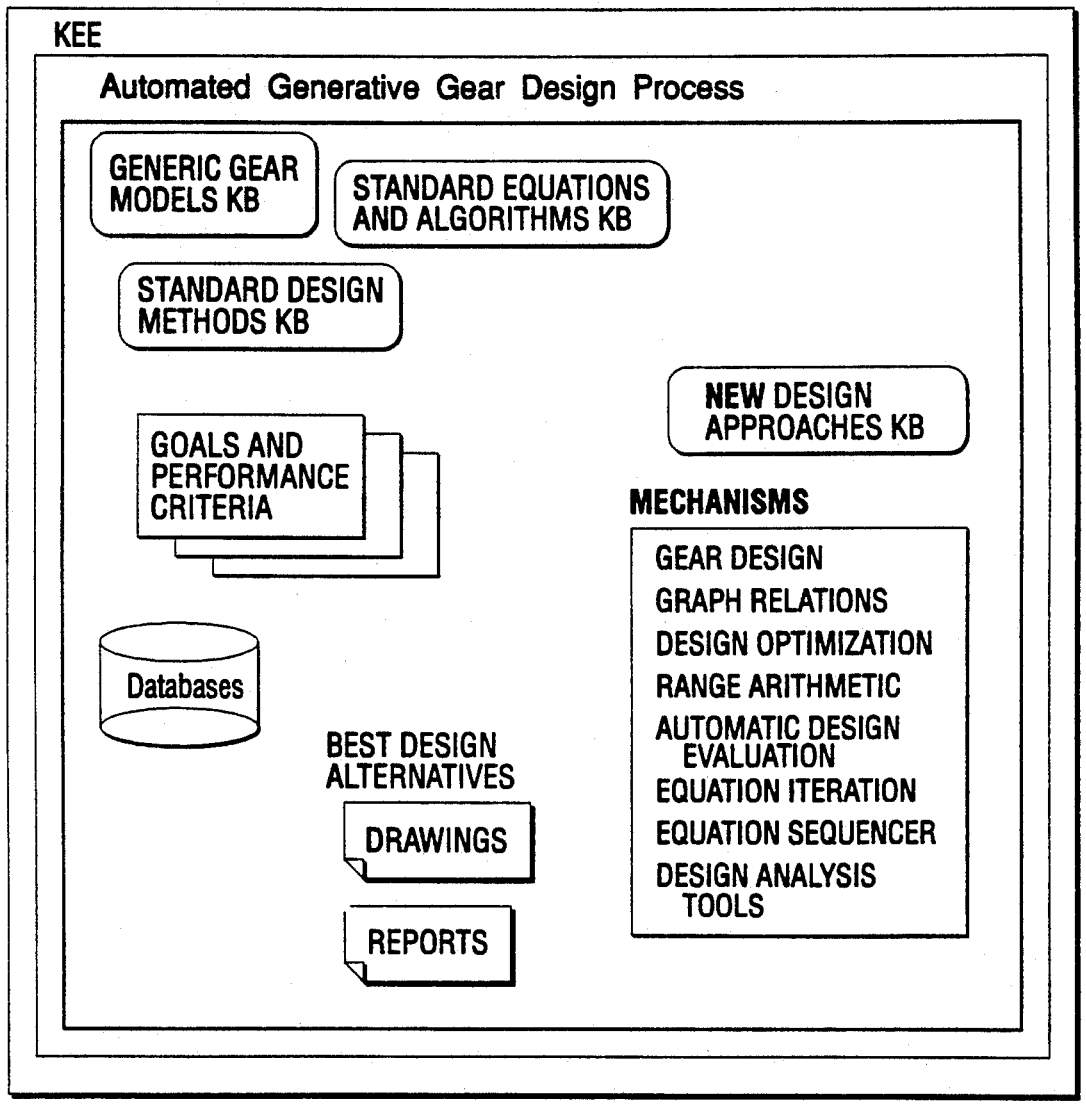

FIG. 5 shows a mid-level architectural diagram of the process of the present invention. Knowledge about generic gear and gearset models, standard design methods, standard equations and algorithms is available to the automated process from knowledge bases, and information on inspection tools, materials, lubricants, and cutting tools are available from emulated or actual databases. Some of the mechanisms which comprise this invention and new Design Approaches developed as part of this process are shown in the lower right.

Figure 6:
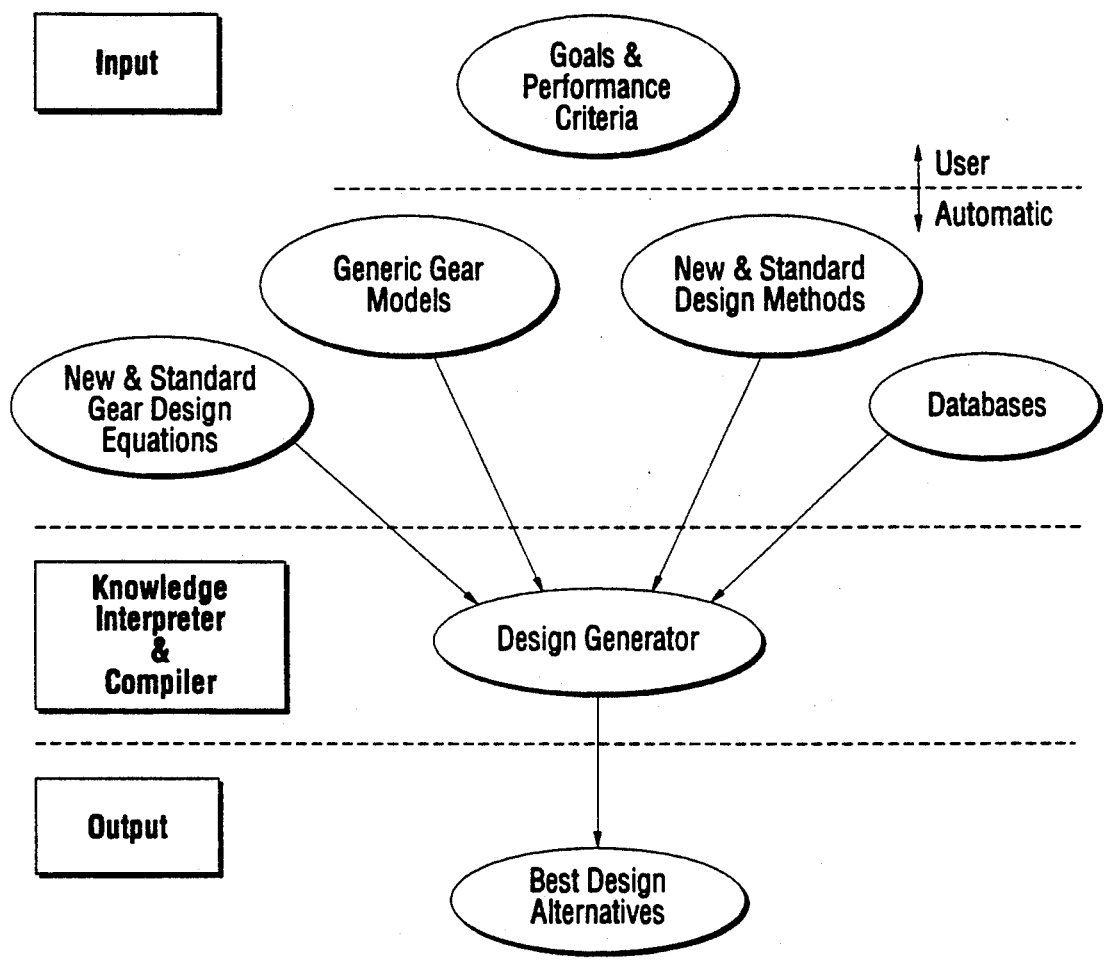
FIGS. 6 and 7 provide an overview of process flow for the automated generative gear design process.

FIG. 6 shows the high level flow of the process. Goals and performance criteria are specified as input to the process by the gear designer. The process automatically selects from knowledge bases the required;
1) new and standard gear and gearset design equations and algorithms,
2) generic gear and gearset models, and
3) new and standard Design Approaches.

Figure 7:
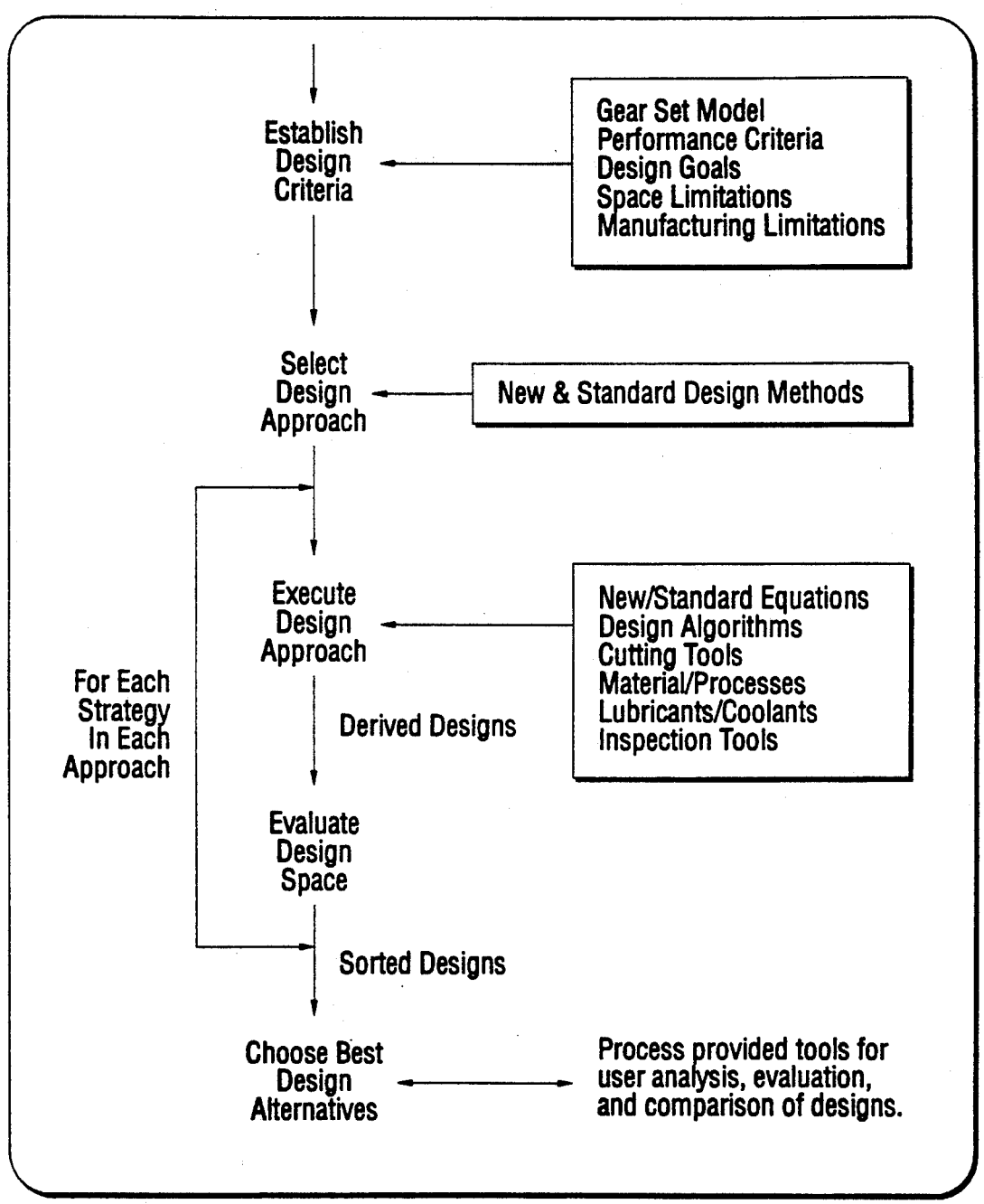

Information on cutting tools, inspection tools, materials, and lubricants are retrieved from databases. The generated designs are evaluated and ranked, with the best design alternatives displayed to the user graphically and tabularly. The process flow is show in more detail in FIG. 7.

Figure 8:
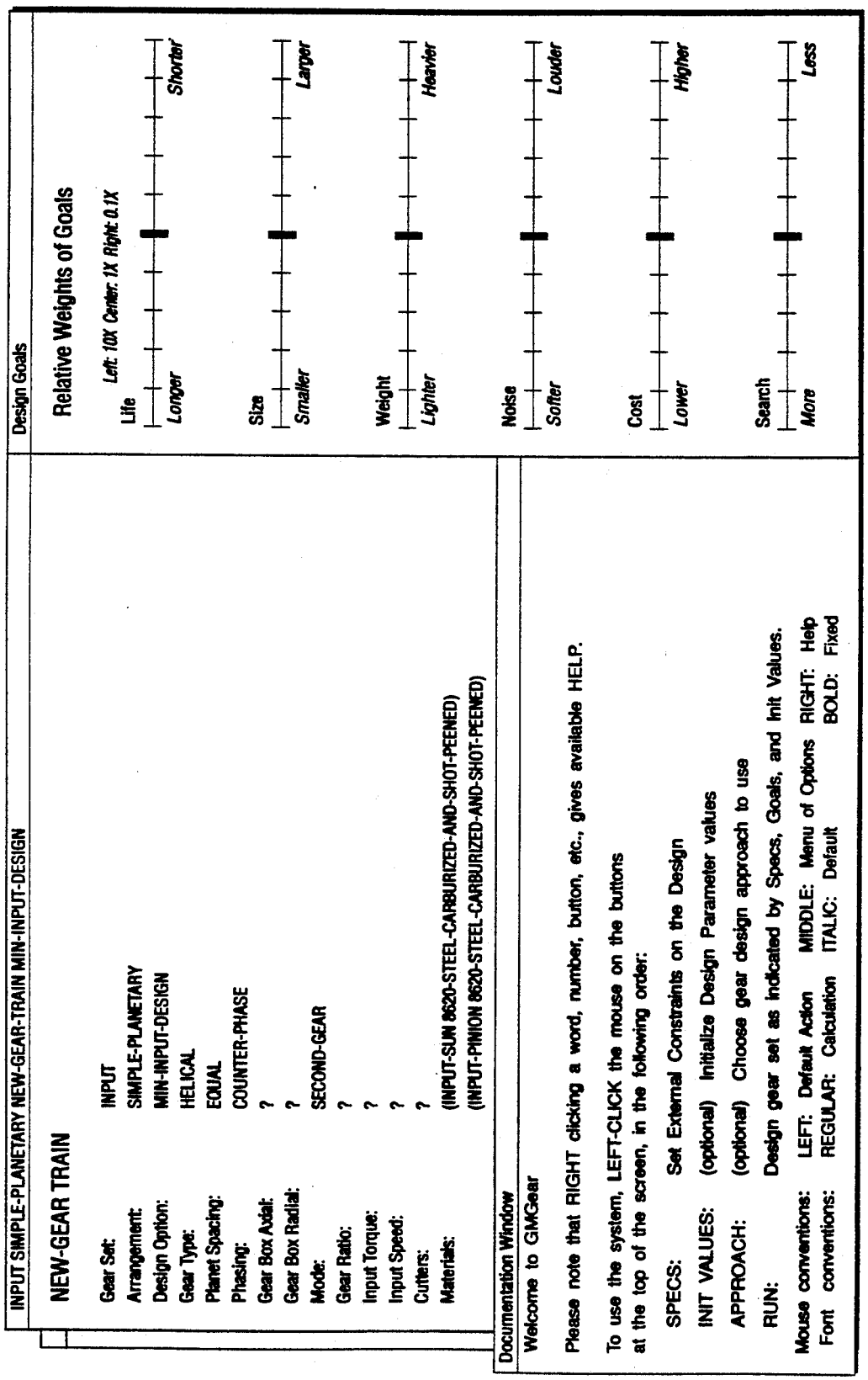
FIG. 8 shows the initial screen of the computerized automated generative gear design process, with default setting for design goals and high level constraints.

The interaction of a gear designer with the automated generative gear design process is shown beginning with FIG. 8. FIG. 8 is a dump of the first computer screen presented to the gear designer who is using the process to design gearsets. The lower left window gives instructions on process use.

FIG. 9 shows interaction between the gearset designer and the process. The right-hand window allows the designer to specify relative weights for the design goals, the high-level purpose, of the gearset to be designed. Specific goals relate to major performance areas for a gearset and include life, size, weight, noise, and cost. The gearset designer indicates which aspects of a design are the most important. For example, a luxury car may have a high weighting for quietness and a relatively low weighting for cost, where a sports car may have a high weighting for size, weight, and life characteristics. The goals are set by moving a slide bar. A weighted sum of the individual evaluation characteristics are applied to the overall evaluation of the gearset.

The individual characteristics themselves are evaluated using equations that were developed by expert gear designers. Parameters that relate to a specific area, such as noise, are combined to give a curve that the expert feels reflects the variation in "goodness" of that area with respect to a value scale.

The left-hand window in FIG. 9 shows high-level constraints to be applied to the gearset design. Default values displayed have been chosen by the system based on information related to the "site" and "user" profiles. These profiles describe the gearsets most frequently designed by the company i.e. locomotive gears vs. plastic windshield gears, and by the particular gear designer, i.e. manual vs. automatic gearsets or gearsets for turbine engines vs. submarine missiles. The gear designer can override any default values, and can provide to the process additional high-level constraints. Constraints set by the designer are treated as "hard" or inviolatable constraints by the process.

Figure 10:
FIG. 10 shows the recommended choice of Design Approaches, based on the goals and high-level constraints entered by the gear designer.

FIG. 10 shows what appears on the screen when the gear designer chooses to review Design Approaches or methods, and shows the next step in the automated generative gear design process. Based on the relative weights assigned to the goals, and the high level constraints applied by the gear designer, the process recommends several possible Design Approaches. The Design Approach given the strongest recommended use is listed first, and is noted as the suggested approach. The designer may choose from among any of the possible Design Approaches. The process tracks decisions made by the designer that do not concur with process recommendations. Examples of the Design Approaches available are:
1. Analyze Performance
2. Bending Stress Focused
3. Bending Stress Focused Adjusting Proportions
4. Bending Stress Focused Without Advice
5. Bending Stress Test
6. Minimize Planetary Size With Cutter
7. Minimum Compound Planetary Size
8. Minimum Counter Shaft Reverse Size
9. Minimum Counter Shaft Size
10. Minimum Counter Shaft Size With Cutter
11. Minimum Simple Planetary Size FIG. 11 shows the default values selected for pertinent gearset design parameters, based on the selected goals, high-level constraints, and Design Approach. This screen is displayed when the gear designer is satisfied with the Design Approach and moves to the next level of detail, which is to review specific values assigned to the more influential gear design parameters. Again, the gear designer has the option of over-riding these recommended values. This is another feature the automated generative gear design process provides to the user to control the design generation manually. The designer can control the design space by controlling the range of acceptable values for key parameters. For example, the designer may want to specify that the bending stress must be below a certain level for a particular application (i.e. the difference in windshield wiper and locomotive gearsets). Over-rides by the designer are considered a hard constraint by the process, and will be tracked as "user-specified" rather than "process-recommended". The process uses the constraint to control which designs are discarded and to scale evaluation of stress-related characteristics.

The right-hand window shows the specific gearset design strategies that will be applied by the chosen Design Approach, i.e BENDING-STRESS-FOCUSED. When the designer is satisfied with the initial values assigned the design parameters and with the Design Approach, the user selects the "Run" option to generate gearset designs.

When the "Run" option is chosen, the Equation Sequencer part of the process chooses equations from the standard and specially developed gearset design equations. This choice is based on the Design Approach and initial parameter values. The Equation Sequencer permits the process to find a sequence of equations to calculate the values that result from applying the selected Design Approach to the inputs (initial parameter values), or to determine there is no such sequence. The Equation Sequencer is controlled by a Calculate command developed as part of the Design Approach. The Calculate command notifies the Equation Sequencer to select the equations necessary to determine values for the expected output from the selected Design Approach. It also transfers the names of parameters to be iterated over to the Equation Iteration portion of the process. The iteration parameters are also dependent on the Design Approach. The Sequencer first determines what inputs are available from the designer, from initial defaults, and from the results of previous design steps. Next, the output symbols are mapped into the gear parameters that must be calculated.

With the initial inputs and desired outputs collected, the Sequencer proceeds in "backchain" fashion. An output is selected, and the Sequencer tried to find an equation that can either compute that output from the available inputs, or from other parameters that can ultimately be computed from the available inputs by other equations.

Each equation is in a form where the quantity being computed is isolated on the left-hand-side (LHS), with the equation inputs appearing on the right-hand-side (RHS). Qualifiers on the symbols are included. The sample equation below has a single LHS qualifier:

$$C = (N_g + N_p) / (2 * P_n * \cos y)$$

for (external-mesh-of gear-pairs)

The backchain process begins by searching for an equation whose LHS, the quantity being computed, can successfully match the selected output parameter. The LHS symbol qualifier in this example restricts the application of this equation to an external mesh gear pair. All equations that can match the selected output parameter are collected.

These equations are sorted by priority with the more exacting equations having the highest priority. The highest priority equation is then checked for qualifiers on its inputs, or RHS symbols. These qualifiers must also be compatible with the LHS parameter choice. Then for each RHS symbol, the process checks whether that parameter is already known or assumed; if not, backchaining begins to select the sequence of equations resulting in a LHS that matches the unknown RHS symbol. Special steps must be taken to continue backchaining when equations are qualified by numeric conditions, contain an iteration over a set, etc.

The process selects the equation sequences needed to satisfy the set of outputs. Intermediate parameters that are part of a successful sequence are remembered so that subsequent equations can take advantage of them. The Equation Sequencer has several techniques for making the search more efficient. This helps linearize what would otherwise be an exponential search.

When the sequence is complete, it is compiled into a LISP function that accepts the initial inputs and returns the requested outputs. The qualifiers on the equations have been met and carry no runtime penalty. A typical sequence has 300 to 500 equations and can be evaluated 4 to 10 times per second. This permits several hundred design cases involving 100,000 to 150,000 equation evaluations to be generated in less than a minute.

The Design Approaches consists of several successive iterative strategies for refining design parameters. This is because designing good gears involves tuning many geometric parameters to achieve a balance. For example, clearances have to be observed; material strengths must not be exceeded; performance safety margins must be adhered to; desirable qualities should be optimized. Accomplishing these goals simultaneously is difficult by traditional gear design methods, and is heavily dependent on the skill and intuition of the gear designer. Experienced designers have good intuition about what will happen to some performance parameter when a particular geometric parameter is changed. When a half dozen parameters are changed at once, it becomes much more difficult. The several successive iterations developed for the automated generative gear design process iterates over several parameters simultaneously, resulting in several hundred possible designs that are evaluated and ranked for presentation to the gearset designer. The design space is generated according to the goals and constraints supplied by the gear designer, and tools (described later) are provided to permit the designer to explore the design space.

The system displays to the number of iterations performed at each step, the parameters being iterated, and the range and increments over which the iteration occurs. The automatic equation iteration offers several advantages over traditional computerized gear analysis programs.

First, the equations used to determine and evaluate design parameters are themselves data. As better models of gear performance are developed, equations can be modified directly by the gear designer, and the improved accuracy is of immediate utility. Rather than freezing expertise in a difficult to modify and maintain traditional computer code that requires knowledge of the language itself, this process becomes a tool for experimenting. The details of how calculations are done are accessible to the gear designer.

Secondly, design approaches are expressed in the process in a high level iteration language that is understandable by the gear designer. This permits the designer to develop different approaches without modification to the underlying program. Rather than freezing expertise, the process becomes a springboard for the development of new approaches.

Finally, the equation iterator separates the statement of the high level approach from the detailed calculations used. The approach states what parameters should be calculated, and the initial values state what is known; the process itself determines the sequence of equations required to develop the outputs from the inputs. Thus, approaches can make use of new, more accurate equations without changes to the approaches themselves.

Figure 12:
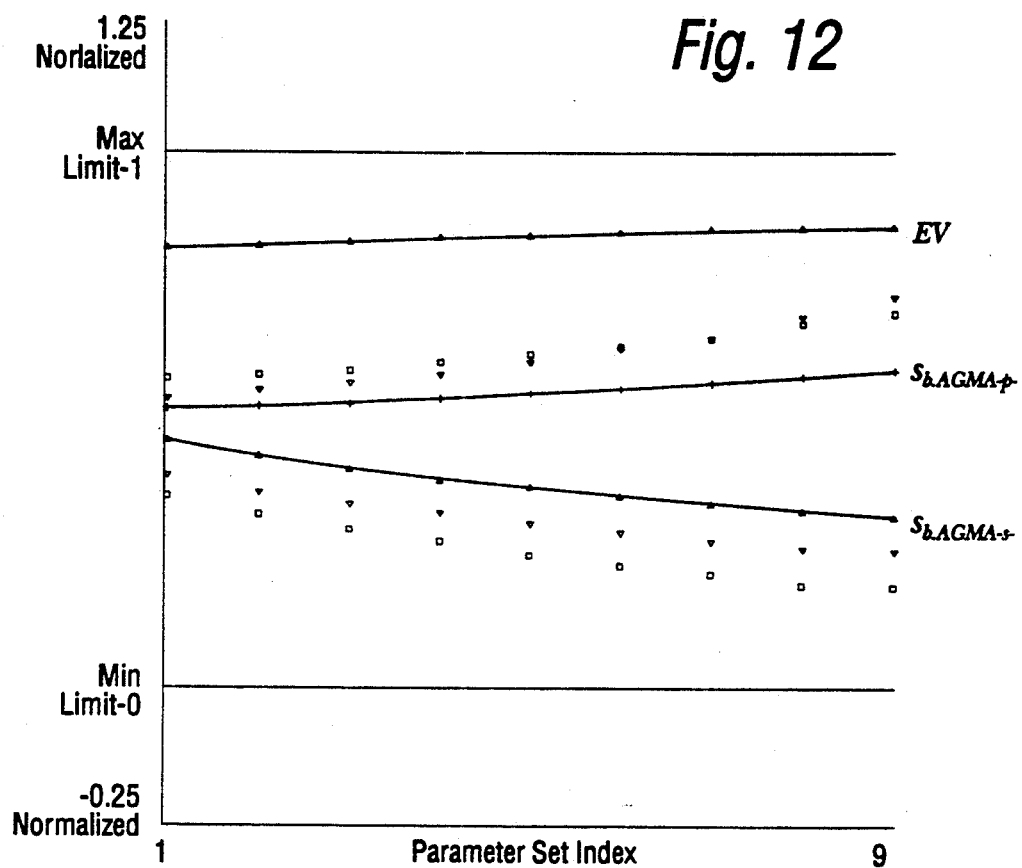
FIG. 12 shows a graphical representation across several designs of the primary parameter, which is automatically chosen based on the design goals, high-level constraints, and Design Approach. The graph represents the best designs, based on the relative evaluation made automatically by the process. The relative evaluation is also graphically displayed.

When design generation is complete, the results are displayed graphically as shown in FIG. 12. The process displays the parameter that conveys the most information about the chosen design approach and the values of the associated evaluation for each of the nine top-ranked designs. The gear designer is offered an alternative list of gear parameters that can be displayed graphically.

The designer can select any point on the graph show in FIG. 12 and the process will display both the final value and absolute limits for the gear parameters associated with that design.

Figure 13:
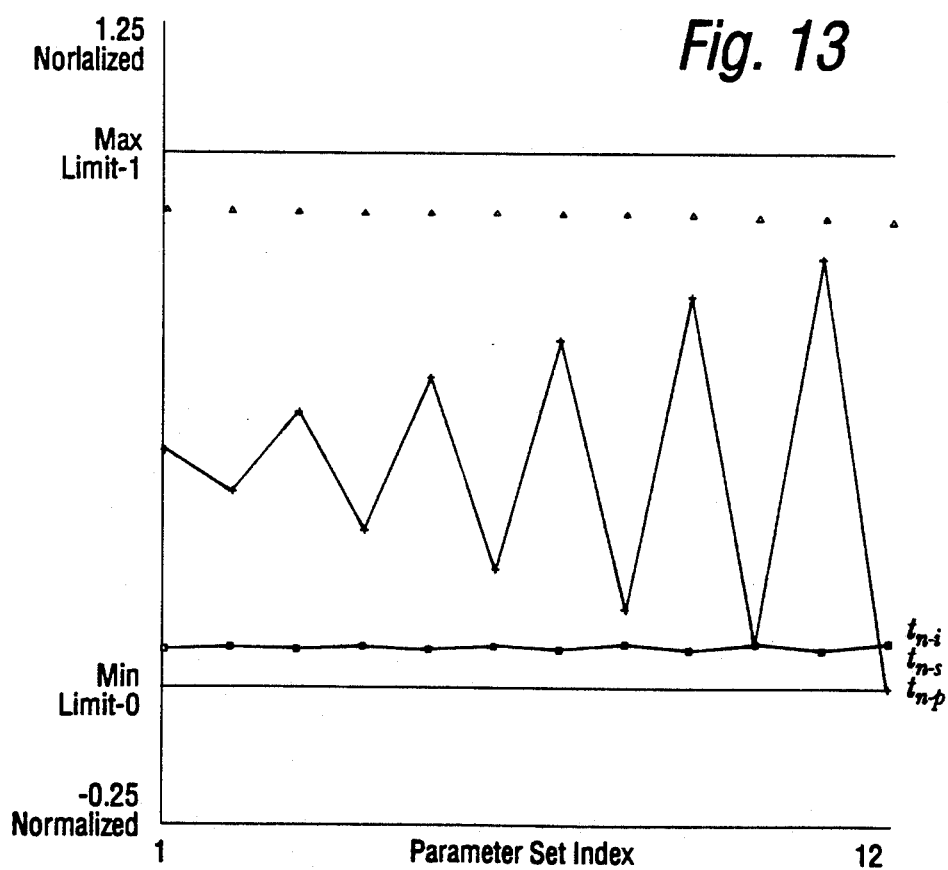
FIG. 13 shows a graph across several designs of a parameter selected by the gear designer.

FIG. 13 shows a graph of a parameter chosen by the gear designer. The automatically generated gearset designs can be sorted by parameter value in different ways. These include sorting by minimum, maximum, the center of the limits range, balancing the maximum or minimum, against a target value, the "best" evaluation, against the limit. The set of all designs can also be restored to the original order of ranking suggested by the process.

The embodiments of the invention in which an exclusive property or privilege is claimed are defined as follows:

1. A computer implemented method of generating a gear set design, said design being based on a problem specification which is input by the user and which includes a plurality of characteristics of the design as well as desired weighting of each of a plurality of design goals, said gear set design including a plurality of independent and dependent parameter values; said method comprising the steps of:
   a. selecting one of a plurality of design approaches based on the design specification;
   b. selecting at least one of said plurality of independent parameters of the gear set design based on the design approach;
   c. determining a range over which said selected independent parameter is to be varied based on the characteristics of the design and a default range for one or more of the unselected ones of said independent parameters,
   d. varying the selected independent parameter over said range to generate a gear design space including a plurality of gear set designs,
   e. limiting said design space to those designs which are within predetermined dependent parameter ranges,
   f. ranking the designs of step e. based on the design goal weights.
   g. repeating steps b–f for each of the remaining ones of said independent parameters.

* * * * *